United States Patent [19]
Shiralagi et al.

[11] Patent Number: 5,904,552
[45] Date of Patent: May 18, 1999

[54] METHOD OF RESISTLESS PATTERNING OF A SUBSTRATE FOR IMPLANTATION

[75] Inventors: Kumar Shiralagi, Chandler; Danny L. Thompson, Mesa, both of Ariz.

[73] Assignee: Motorola, Inc., Schaumburg, Ill.

[21] Appl. No.: 08/806,270

[22] Filed: Feb. 25, 1997

[51] Int. Cl.[6] .................................................. H01L 21/425
[52] U.S. Cl. .................... 438/514; 438/552; 438/694; 438/723; 438/756; 438/787
[58] Field of Search ............................. 437/228 M, 228 I; 438/715, 719, 723, 514, 552, 694, 756, 787

[56] References Cited

U.S. PATENT DOCUMENTS

| | | | |
|---|---|---|---|
| 5,168,072 | 12/1992 | Moslehi | 437/31 |
| 5,320,972 | 6/1994 | Wylie | 437/31 |
| 5,427,970 | 6/1995 | Hsue et al. | 437/43 |
| 5,428,240 | 6/1995 | Lur | 257/389 |
| 5,597,756 | 1/1997 | Fazan et al. | 437/52 |
| 5,672,539 | 9/1997 | Thakur et al. | 437/70 |

*Primary Examiner*—Charles Bowers
*Assistant Examiner*—Reneé R. Berry
*Attorney, Agent, or Firm*—Eugene A. Parsons; William E. Koch

[57] ABSTRACT

A method of ion implanting a substrate is disclosed, which includes providing a substrate having a surface. A sacrificial layer of semiconductor material is formed on the surface and resistlessly patterning to define masked and unmasked portions. The unmasked portions are etched away to form an implantation mask on the substrate. Ions are implanted in the substrate underlying the etched away unmasked portions and the sacrificial layer is removed.

16 Claims, 1 Drawing Sheet

METHOD OF RESISTLESS PATTERNING OF A SUBSTRATE FOR IMPLANTATION

FIELD OF THE INVENTION

The present invention pertains to the fabrication of semiconductor devices and more specifically to improved masking techniques during semiconductor device fabrication.

BACKGROUND OF THE INVENTION

In the semiconductor field it is common to sequentially perform various steps in the fabrication of a semiconductor device. The steps can include growing several different layers of semiconductor material and the use of various masks and etching steps to form the desired devices and terminals on the devices. In some methods, masking material, e.g. nitride/oxide or the like, is applied and semiconductor material is grown over masked and unmasked areas. The material on the masked areas is then removed by etching and lift-off. In some instances material is selectively grown in unmasked areas and the masking material is then removed. In some processes a photoresist mask is used to define and develop a hard mask, i.e. a metal mask, a nitride mask, etc.

Generally, in these prior art methods of fabricating semiconductor devices, etching is required to remove unwanted material and masks are removed by etching, solvent, or the like. During the etching and/or mask removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

Thus, these prior art techniques involve many process steps such as resist spinning, exposure, developing, cleaning and so on. All of these processes can introduce contamination, decrease yield, etc. A further problem that arises is that the structure or substrate (generally a wafer) must be removed from the growth chamber to remove the masking material. The structure is then masked again and re-introduced into the growth chamber for re-growth. Thus, the prior art techniques keep the wafer vacuum incompatible.

In addition to the masking and etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer must be etched and/or masked, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Many of these problems have been overcome by the use of resistless patterning. However, in the resistless patterning approach the oxide mask formed is very thin. This thin oxide mask cannot serve as an implantation mask in normal processing.

Accordingly, it would be highly desirable to provide a new and improved resistless process for implantation.

It is a purpose of the present invention to provide a new and improved method of implantation having reduced steps.

It is another purpose of the present invention to provide a new and improved method of implantation which is vacuum compatible.

It is still another purpose of the present invention to provide a new and improved method of implantation which does not require the introduction of contaminants, such as photoresist, solvents and etchants.

It is a further purpose of the present invention to provide a new and improved method of implantation which is much simpler and includes less chance of contamination of the devices.

And a further purpose of the present invention is to provide a new and improved method of implantation which can be a completely dry process.

SUMMARY OF THE INVENTION

Briefly, to achieve the desired objects of the instant invention in accordance with a preferred embodiment thereof, provided is a method of ion implanting a substrate which includes providing a substrate having a surface. A sacrificial layer of semiconductor material is formed on the surface and resistlessly patterning to define masked and unmasked portions. The unmasked portions are etched away to form an implantation mask on the substrate. Ions are implanted in the substrate underlying the etched away unmasked portions and the sacrificial layer is removed.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 1:
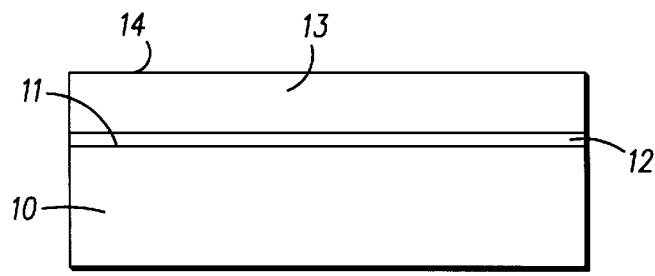
FIGS. 1–6 are simplified sectional views of a substrate illustrating several sequential steps in a masking and implantation process in accordance with the present invention.

Turning now to the drawings in which like reference characters indicate corresponding elements throughout the several views, attention is first directed to FIGS. 1–4 which illustrate a method of resistlessly masking a silicon substrate 10 for implantation, in accordance with the present invention. It should be understood that substrate 10 can be any semiconductor material, and that while silicon is utilized herein for purposes of this description other III-V compounds and other semiconductor materials may be utilized. Referring specifically to FIG. 1, a simplified sectional view of silicon substrate 10 having a surface 11 is illustrated. It should be understood that substrate 10 might simply be a supporting structure, such as a wafer or the like, or it might include various layers formed on or in the supporting structure.

Surface 11 of silicon substrate 10 has an etch stop layer 12 of a native oxide formed thereon. The formation of etch stop layer 12 when of a native oxide forms generally instantaneously upon exposure to air. Those skilled in the art will readily understand that etch stop layer 12 can be formed of other materials such as a deposited nitride. It should also be understood that etch stop layer 12 is not always necessary to the present invention as will be described presently.

Still referring to FIG. 1, a sacrificial layer 13 having a surface 14, is formed on etch stop layer 12. Sacrificial layer 13 is formed of material including any of crystalline, polycrystalline, amorphous, etc. formed by any known method such as by sputtering or deposition and is silicon in this preferred embodiment.

Figure 2:
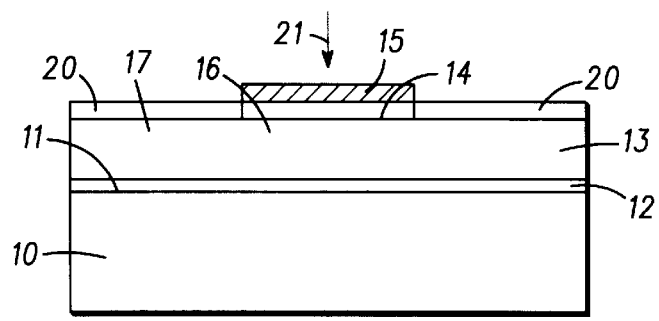

Turning now to FIG. 2, a mask 15 is positioned adjacent to surface 14 of sacrificial layer 13 for patterning surface 14, as will be explained presently. Generally, surface 14 can be a passivated surface (preferably hydrogen passivated) that will enable oxide patterning. Mask 15 generally is a shadow or metal mask but, in some special applications, it can be formed in the well known manner with photolithography as in an aligner or stepper (generally includes a projected image from a mask). As will become apparent presently, one of the major advantages of the present technique is that photolithography and the like are not necessary for the described masking operations. In a preferred embodiment, mask 15 is a mask plate. In any case, mask 15 is positioned adjacent surface 14 so as to define one or more covered portions 16 on surface 14 beneath mask 15 and one or more uncovered portions 17 on surface 14.

Uncovered portions 17 of surface 14 are exposed to a bright light preferably including deep ultraviolet, represented by arrows 21 in FIG. 2. The bright light may be, for example, the type typically used in aligners, steppers, or E-beam devices in the semiconductor industry. The term "deep ultraviolet" refers to light in the ultraviolet range, generally with a wavelength in the range of 180 to 250 nanometers. In the present specific example, it is believed that the 185 nm light generates ozone due to optical excitation. Therefore, the excitation wavelength that is most suitable for efficient ozone generation is also the most efficient to use, although virtually any ultraviolet light will produce the desired result. It is believed that exposure to other wavelengths, such as 248 nm in a specific example, modifies the composition of the surface oxide by forming a different kind of oxide or complex oxide molecules that are more stable than the native oxide. The exposure to light can be performed under a lamp. However, when the light is collimated, as in an aligner or stepper, sharp features can be defined in uncovered portion 17. A thin oxide mask 20 with a thickness less than approximately 2 nm is produced on uncovered portions 17 of surface 14.

Figure 3:
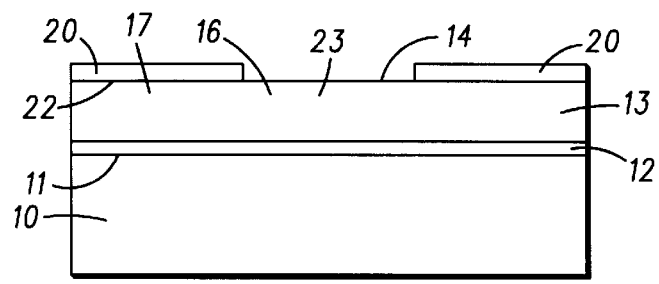

Once oxide mask 20 is grown, mask 15 is removed to expose covered portion 16, as illustrated in FIG. 3. Oxide mask 20 then serves as a mask for etching sacrificial layer 13. Thin oxide mask 20 defines masked portions 22 and unmasked portions 23, corresponding to the uncovered portions 17 and the covered portions 16 respectively.

Figure 4:
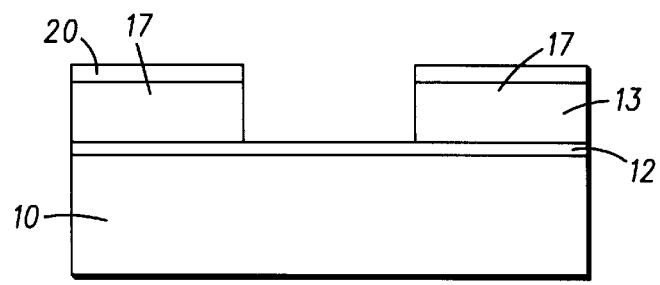

Referring now to FIG. 4, unmasked portions 23 of sacrificial layer 13 are removed to form an implantation mask on substrate 10. Unmasked portions 23 are removed in any known manner, including etching by wet or dry methods. Sacrificial layer 13 can be etched all the way down to etch stop layer 12 or slightly above depending on the depth of the implantation desired.

Figure 5:
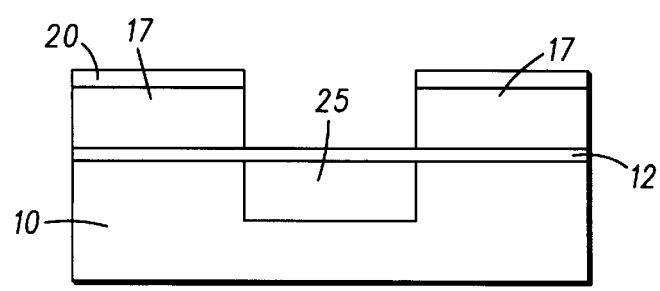
Figure 6:
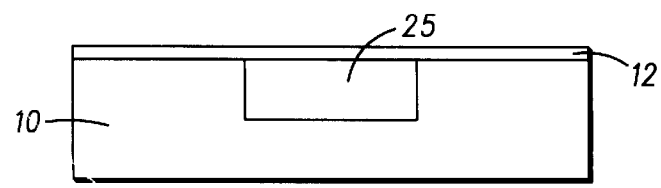

Turning now to FIGS. 5 and 6, the steps in the implantation of substrate 10 are illustrated. Referring specifically to FIG. 5, sacrificial layer 13 is utilized as a mask for the implantation of substrate 10. Substrate 10 is implanted, using ion implantation methods known to those skilled in the art, only in an implantation area 25 underlying the etched away unmasked portions of sacrificial layer 13. While the oxide mask 20 is insufficient to prevent substrate 10 from being implanted in areas other than those desired, sacrificial layer 13 successfully intercepts the ions. Thus, sacrificial layer 13 and area 25 of substrate 10 underlying the removed portions of sacrificial layer 13 are implanted.

After implantation, sacrificial layer 13 is removed as illustrated in FIG. 6. Implanted sacrificial layer 13 is removed by selective etch which does not damage substrate 10. The removal of sacrificial layer 13 can be controlled by employing etch stop layer 12. However, those skilled in the art will understand that if precise control of the removal of sacrificial layer 13, such as to stop the etch at the surface of substrate 10, is not needed, etch stop layer 12 may be omitted.

Thus, a new and improved resistless process for implantation is disclosed which provides a method of implantation having reduced steps, which is vacuum compatible and which does not require the introduction of contaminants, such as photoresist, solvents and etchants. The disclosed method of implantation is much simpler and includes less chance of contamination of the devices and can be a completely dry process.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A method of ion implanting a substrate comprising the steps of:

providing a substrate having a surface;

forming a sacrificial layer of semiconductor material on the surface;

resistlessly patterning the sacrificial layer including positioning a hard mask adjacent the sacrificial layer so as to define exposed portions and unexposed portions and selectively directing a bright light onto the exposed portions to grow a thin oxide mask on the exposed portions of the sacrificial layer to define masked and unmasked portions of the sacrificial layer;

using the thin oxide mask, etching away unmasked portions of the sacrificial layer to form the sacrificial layer into an implantation mask on the substrate;

implanting the sacrificial layer and the substrate underlying the etched away unmasked portions; and removing the thin oxide mask and the sacrificial layer.

2. A method of ion implanting a substrate as claimed in claim 1 further including the step of forming an etch stop layer on the surface of the substrate prior to the step of forming the sacrificial layer.

3. A method of ion implanting a substrate as claimed in claim 2 wherein the step of forming an etch stop layer includes forming a native oxide layer.

4. A method of ion implanting a substrate as claimed in claim 2 wherein the step of forming an etch stop layer includes forming a nitride layer.

5. A method of ion implanting a substrate as claimed in claim 1 wherein the step of forming the sacrificial layer includes forming a sacrificial layer by one of sputtering and deposition.

6. A method of ion implanting a substrate as claimed in claim 5 wherein the step of forming the sacrificial layer includes forming a sacrificial layer of silicon in any of crystalline, poly-crystalline, and amorphous form.

7. A method of ion implanting a substrate comprising the steps of:

providing a substrate having a surface;

forming an etch stop layer on the surface of the substrate;

forming a sacrificial layer of semiconductor material on the etch stop layer;

resistlessly patterning the sacrificial layer including positioning a hard mask adjacent the sacrificial layer so as to define exposed portions and unexposed portions and selectively directing a bright light onto the exposed portions to grow a thin oxide mask on the exposed portions of the sacrificial layer to define masked and unmasked portions of the sacrificial layer;

using the thin oxide mask, etching away unmasked portions of the sacrificial layer to form the sacrificial layer into an implantation mask on the etch stop layer;

using the implantation mask, implanting the sacrificial layer and the substrate underlying the etched away unmasked portions of the sacrificial layer; and removing the thin oxide mask and the sacrificial layer.

8. A method of ion implanting a substrate as claimed in claim 7 wherein the step of forming an etch stop layer includes forming a native oxide layer.

9. A method of ion implanting a substrate as claimed in claim 7 wherein the step of forming an etch stop layer includes forming a nitride layer.

10. A method of forming a mask comprising the steps of:

providing a substrate having a surface;

forming a sacrificial layer of semiconductor material on the surface;

positioning a hard mask adjacent the sacrificial layer so as to define covered and uncovered portions;

selectively directing a bright light onto the uncovered portion to grow a thin oxide mask on the uncovered portion, the thin oxide mask defining masked and unmasked portions corresponding to the uncovered and the covered portions respectively; and etching away unmasked portions of the sacrificial layer to form a mask on the substrate.

11. A method of forming a mask as claimed in claim 10 further including the step of forming an etch stop layer on the surface of the substrate prior to the step of forming the sacrificial layer.

12. A method of forming a mask as claimed in claim 11 wherein the step of forming an etch stop layer includes forming a native oxide layer.

13. A method of forming a mask as claimed in claim 11 wherein the step of forming an etch stop layer includes forming a nitride layer.

14. A method of ion implanting a substrate as claimed in claim 1 wherein the step of growing the thin oxide mask includes growing the thin oxide mask to a thickness less than approximately 2 nm.

15. A method of ion implanting a substrate as claimed in claim 7 wherein the step of growing the thin oxide mask includes growing the thin oxide mask to a thickness less than approximately 2 nm.

16. A method of forming a mask as claimed in claim 10 wherein the step of growing the thin oxide mask includes growing the thin oxide mask to a thickness less than approximately 2 nm.

* * * * *